United States Patent
Kim

(10) Patent No.: US 8,048,803 B2
(45) Date of Patent: Nov. 1, 2011

(54) METHOD FOR FORMING CONTACT PLUG IN A SEMICONDUCTOR DEVICE

(75) Inventor: Jae-Hong Kim, Ichon-shi (KR)

(73) Assignee: Hynix Semiconductor Inc., Icheon-si (KR)

(*) Notice: Subject to any disclaimer, the term of this patent is extended or adjusted under 35 U.S.C. 154(b) by 46 days.

(21) Appl. No.: 11/861,973

(22) Filed: Sep. 26, 2007

(65) Prior Publication Data

US 2008/0081469 A1 Apr. 3, 2008

(30) Foreign Application Priority Data

Sep. 28, 2006 (KR) .................. 10-2006-0095063

(51) Int. Cl.
 *H01L 21/44* (2006.01)

(52) U.S. Cl. ........ 438/672; 438/626; 438/633; 438/634; 257/E21.579; 257/E21.583; 257/E21.585

(58) Field of Classification Search .................. 438/618, 438/622, 626, 633, 634, 668, FOR. 405; 257/E21.579, E21.583, E21.585

See application file for complete search history.

(56) References Cited

U.S. PATENT DOCUMENTS

| | | | | |
|---|---|---|---|---|
| 4,639,288 A | * | 1/1987 | Price et al. | 438/430 |
| 5,739,579 A | * | 4/1998 | Chiang et al. | 257/635 |
| 6,090,718 A | * | 7/2000 | Soga et al. | 438/714 |
| 6,103,619 A | * | 8/2000 | Lai | 438/638 |
| 6,171,951 B1 | * | 1/2001 | Lee et al. | 438/640 |
| 6,388,281 B1 | * | 5/2002 | Jung et al. | 257/295 |
| 6,726,534 B1 | * | 4/2004 | Bogush et al. | 451/36 |
| 2004/0014321 A1 | * | 1/2004 | Kwon et al. | 438/692 |
| 2004/0124453 A1 | * | 7/2004 | Kim et al. | 257/295 |
| 2005/0170625 A1 | * | 8/2005 | Cong et al. | 438/597 |
| 2006/0237723 A1 | * | 10/2006 | Ito | 257/59 |

FOREIGN PATENT DOCUMENTS

KR 1020040081864 A 9/2004

* cited by examiner

*Primary Examiner* — Matthew Smith
*Assistant Examiner* — Quovaunda V Jefferson
(74) *Attorney, Agent, or Firm* — Kilpatrick Townsend & Stockton LLP

(57) ABSTRACT

A method for forming a contact plug in a semiconductor device includes providing a substrate having an insulation layer. A hard mask pattern is formed over the insulation layer. The insulation layer is etched using the hard mask pattern to form a contact hole. A plug material is formed over the hard mask pattern to fill the contact hole. The insulation layer, the hard mask pattern, and the plug material are polished at substantially the same time such that a seam generated in the contact hole while forming the plug material is not exposed.

18 Claims, 7 Drawing Sheets

METHOD FOR FORMING CONTACT PLUG IN A SEMICONDUCTOR DEVICE

CROSS-REFERENCE TO RELATED APPLICATIONS

The present invention claims priority to Korean patent application number 2006-0095063, filed on Sep. 28, 2006, which is incorporated by reference in its entirety.

BACKGROUND OF THE INVENTION

The present invention relates to a method for fabricating a semiconductor device, and more particularly, to a method for forming a drain contact plug of a NAND-type flash memory device.

Recently, the demand for flash memory devices has increased. Flash memory devices can be electrically programmed and erased. Programming refers to writing data to a memory cell. Erasing refers to removing data written to a memory cell. Flash memory devices do not require a refresh function which re-writes data at regular intervals. Research on large scale integration technology has been actively conducted to develop a large-scaled semiconductor device which can store a large amount of data.

A NAND-type flash memory device is developed for the large scale integration of a memory device. In a NAND-type flash memory device, a plurality of memory cells is coupled in series to configure a string, i.e., to form a structure where adjacent cells share a drain and a source. The NAND-type flash memory device is a memory device which sequentially reads data, unlike a NOR-type flash memory device. The programming and the erasing of the NAND-type flash memory device is performed by implanting electrons into a floating gate and emitting the electrons using a Fowler-Nordheim (F-N) tunneling method to control a threshold voltage (Vt).

The NAND-type flash memory device transmits an externally supplied driving voltage, e.g., a bias voltage, to a lower semiconductor structure through a metal line. For instance, the lower semiconductor structure includes a source region and a drain region which are junction regions. A contact plug is generally required to electrically couple the metal line and the source and drain regions.

The contact plug of the NAND-type flash memory device includes a source contact plug (SRCT) and a drain contact plug (DRCT). The source contact plug couples the source region formed in an active region and an upper metal line, e.g., a source line. The drain contact plug couples the drain region and an upper metal line, e.g., a bit line.

Currently, a gate electrode is formed using a self-aligned shallow trench isolation (SA-STI) process in a NAND-type flash memory device under 70 nm to embody a large scale of integration and a micronized pattern.

However, in a gate structure formed using the SA-STI process, a seam in the shape of a keyhole may be generated in a polysilicon layer when forming the polysilicon layer for use as a drain contact plug in a contact hole formed in an insulation layer between gates.

FIGS. 1A to 1D illustrate cross-sectional views of a conventional method for fabricating a drain contact plug.

Referring to FIG. 1A, an insulation layer is formed to have a large thickness over a semi-finished substrate 10 including a source contact plug. A hard mask pattern 15 including a nitride-based material is formed over the insulation layer. The insulation layer is etched using the hard mask pattern 15 as a mask until the substrate 10 is exposed. Thus, a drain contact hole 17 is formed. Reference numeral 13 refers to a patterned insulation layer.

However, a bowing event (refer to 'A') may occur in the patterned insulation layer 13. In other words, portions of the patterned insulation layer 13 may be bent during the etch process when forming the drain contact hole 17 because the insulation layer has a large thickness to be etched. A critical dimension (CD) of the drain contact hole 17 in a portion where the bowing event occurs is represented with reference denotation $CD_1$.

Referring to FIG. 1B, the hard mask pattern 15 is removed using an etch process. The bowing increases when the hard mask pattern 15 is removed. Therefore, the CD of the drain contact hole 17 becomes '$CD_2$'. The hard mask pattern 15 is removed in advance because there may not be a slurry which can simultaneously polish the hard mask pattern 15, the patterned insulation layer 13, and a subsequent polysilicon layer (represented with reference numeral 19 in FIG. 1C) for forming a drain contact plug.

Referring to FIG. 1C, the polysilicon layer 19 for forming the drain contact plug is formed over the patterned insulation layer 13 and fills in the drain contact hole 17 (FIG. 1B). However, the drain contact hole 17 may not be completely filled when the polysilicon layer 19 is formed. A seam in the shape of a keyhole (refer to 'B') may be generated. This result is obtained because the polysilicon layer 19 having a sufficient step coverage characteristic is formed along the surface profile of the drain contact hole 17. The seam is generated at a certain depth ($D_1$) from an upper surface of the patterned insulation layer 13.

Referring to FIG. 1D, a chemical mechanical polishing (CMP) process is performed to polish the polysilicon layer 19. Thus, a drain contact plug 19A is formed. A portion of the patterned insulation layer 13 is removed while polishing the polysilicon layer 19 and an upper portion of the seam is exposed (refer to 'C'). Reference numeral 13A refers to a polished insulation layer 13A. The portion of the patterned insulation layer 13 is removed together with the polysilicon layer 19 because a slurry used for the polishing process has a polish selectivity ratio of the polysilicon layer 19 to the hard mask pattern 15 to the patterned insulation layer 13 in a range of approximately 1 to 2:0.3 to 0.4:1. There is a small difference between the polishing rate of the polysilicon 19 and the patterned insulation layer 13.

FIG. 2 illustrates a micrographic view showing the seam (refer to B) generated in the drain contact plug 19A in accordance with a conventional drain contact plug formation method. The seam generated in the shape of a keyhole in the drain contact hole 19A is exposed. Thus, a metal line M is formed in an undesirable manner over an upper portion of the drain contact plug 19A.

However, several limitations may occur during a subsequent metal line M formation process for transmitting a signal to the drain contact plug 19A when the seam is exposed. Thus, device characteristics deteriorate. For example, during a cleaning process performed before forming the metal line M, cleaning chemicals may not be sufficiently dried, the drain contact plug 19A may be damaged, a barrier metal layer may be undesirably formed, and unnecessary oxide-based materials including titanium oxide (TiO) may be generated. As a result, the likelihood of an erase failure may increase.

SUMMARY OF THE INVENTION

Embodiments of the present invention are directed to provide a method for forming a contact plug in a semiconductor device, which can reduce an exposure of a seam generated in the shape of a keyhole in a drain contact plug and decrease the likelihood of an erase failure, thereby improving a yield of the device.

In accordance with an aspect of the present invention, there is provided a method for forming a contact plug in a semiconductor device. The method includes providing a substrate having an insulation layer. A hard mask pattern is formed over the insulation layer. The insulation layer is etched using the hard mask pattern to form a contact hole. A plug material is formed over the hard mask pattern to fill the contact hole. The insulation layer, the hard mask pattern, and the plug material are polished at substantially the same time such that a seam generated in the contact hole while forming the plug material is not exposed.

In accordance with another aspect of the present invention, there is provided a method for forming a contact plug in a semiconductor device. The method includes providing a semi-finished substrate with a first insulation layer including a source contact plug. A second insulation layer is formed over the first insulation layer. A hard mask pattern is formed over the second insulation layer. The first and second insulation layers are etched to form a drain contact hole using the hard mask pattern. The substrate is exposed in the drain contact hole. A plug material is formed over the hard mask pattern and fills in the drain contact hole. The second insulation layer, the hard mask pattern, and the plug material are polished at substantially the same time such that a seam generated in the drain contact hole while forming the plug material is not exposed.

DESCRIPTION OF SPECIFIC EMBODIMENTS

Figure 1A:
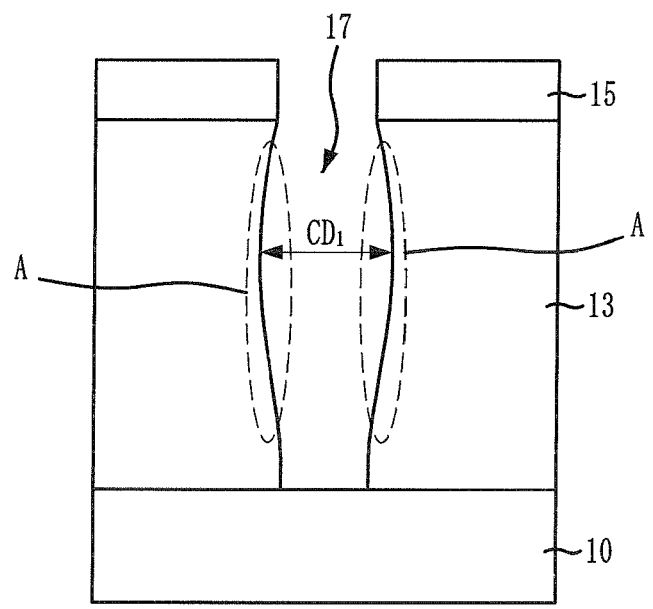
FIGS. 1A to 1D illustrate cross-sectional views of a conventional method for fabricating a drain contact plug.
Figure 1B:
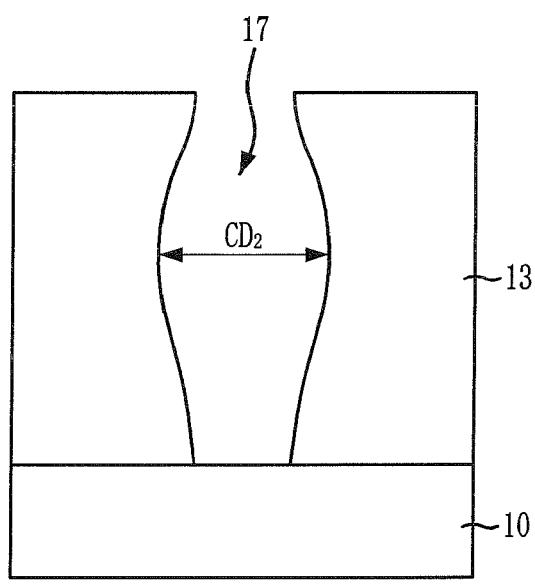

Embodiments of the present invention relate to a method for forming a contact plug in a semiconductor device.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the second layer or between the first layer and the substrate. Furthermore, the same or like reference numerals throughout the various embodiments of the present invention represent the same or like elements in different drawings.

Figure 3A:
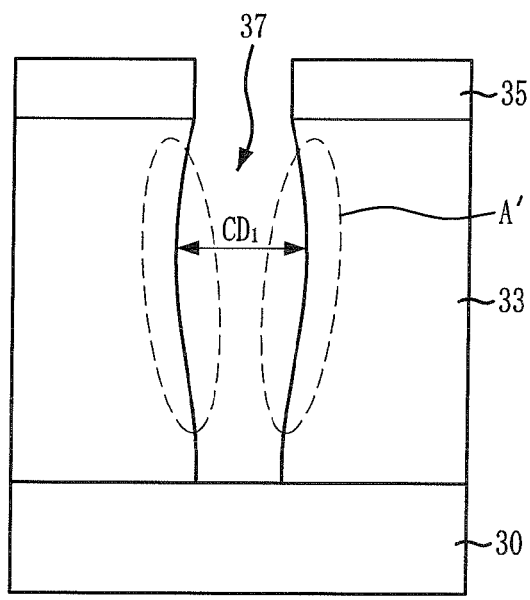
FIGS. 3A to 3C illustrate cross-sectional views of a method for forming a drain contact plug in a NAND-type flash memory device in accordance with an embodiment of the present invention.
Figure 3B:
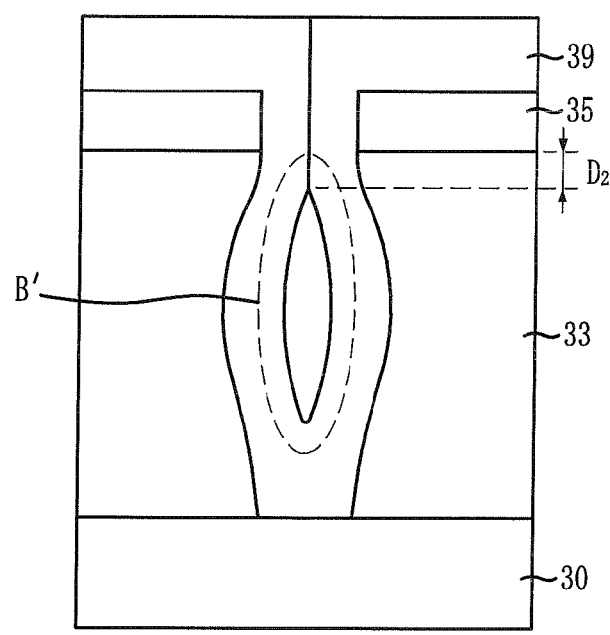
Figure 3C:
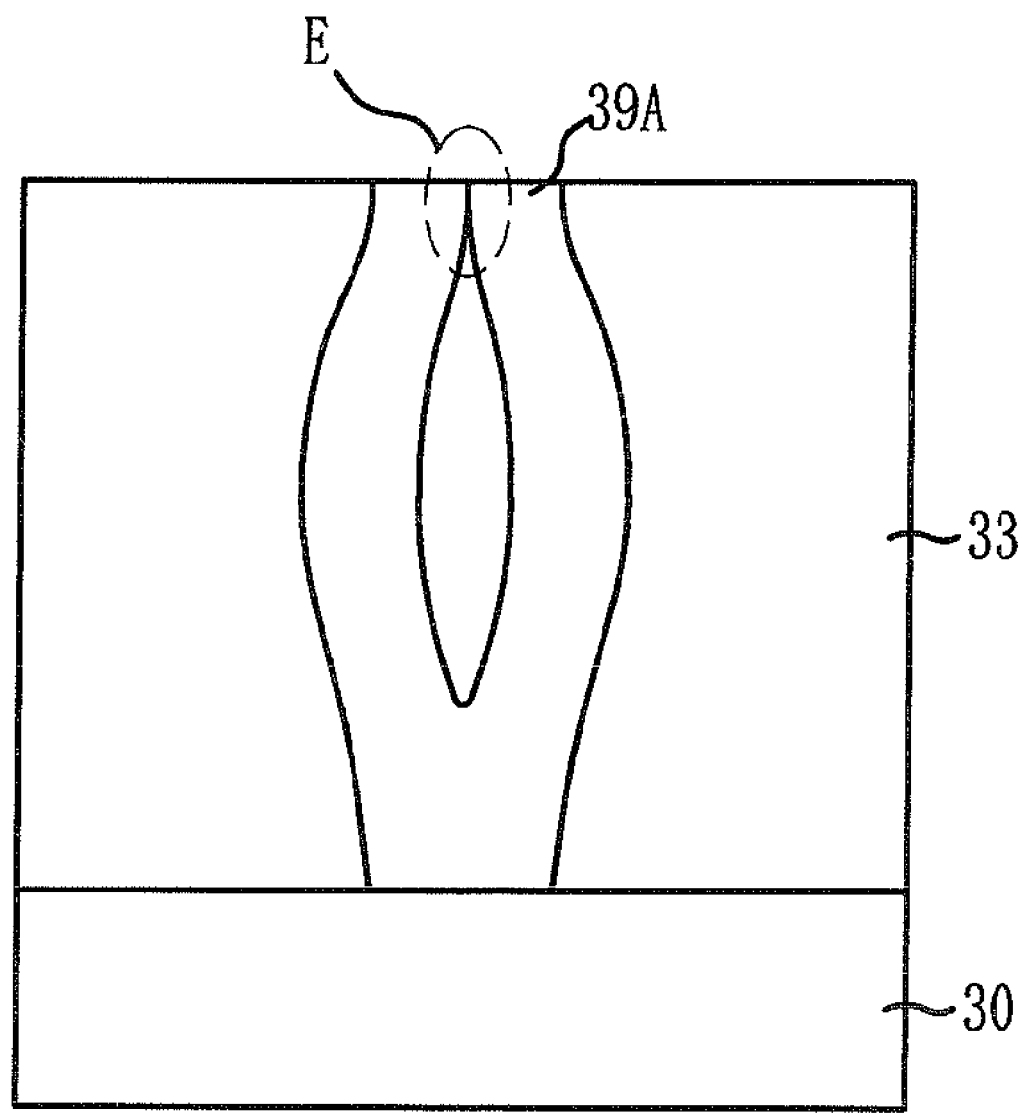

FIGS. 3A to 3C illustrate cross-sectional views of a method for forming a drain contact plug in a NAND-type flash memory device in accordance with an embodiment of the present invention. Drawings showing a process for forming a source contact hole and other prior processes are omitted herein for convenience of description.

Referring to FIG. 3A, a semi-finished substrate 30 including a source contact plug (not shown) is provided. Processes performed up until the formation of the source contact plug are described below.

A nitride-based layer and a first insulation layer are formed over the substrate 30 including a gate electrode functioning as a word line, and source and drain regions. The gate electrode may be formed using a self-aligned shallow trench isolation (SA-STI) or an ASA-STI processes. Although not shown, the gate electrode includes a tunnel oxide layer, a floating gate, a dielectric layer, a control gate, and a conductive layer. Spacers are formed on both sidewalls of the gate electrode. In one embodiment, a nitride-based hard mask may be formed over the conductive layer.

A source contact mask is formed over the first insulation layer using a photo process. The first insulation layer is etched by an etch process using the source contact mask. The source contact mask is removed using a removal process.

The nitride-based layer exposed by the patterned first insulation layer is removed using a cleaning process. A source contact hole is formed to expose the source region formed in the substrate 30. A metal material, i.e., tungsten (W), is formed to fill the source contact hole. The metal material may include other conductive materials such as aluminum (Al) or copper (Cu). The tungsten is planarized using a chemical mechanical polishing (CMP) process. Thus, a source contact plug is formed in the source contact hole.

A second insulation layer is formed over the first insulation layer (not shown) including the source contact plug (not shown). The second insulation layer includes a high density plasma (HDP) oxide layer like the first insulation layer. However, the second insulation layer may include other oxide-based layers besides the HDP oxide layer. In one embodiment, the second insulation layer is formed to have a thickness ranging from approximately 2,000 Å to approximately 5,000 Å.

A hard mask pattern 35 is formed over the second insulation layer. The hard mask pattern 35 includes a nitride-based material. For example, the hard mask pattern 35 is formed by forming a silicon nitride layer using a plasma enhanced chemical vapor deposition (PECVD) method, and etching the silicon nitride layer. In one embodiment, the silicon nitride layer is formed using a gas mixture including silane ($SiH_4$), ammonia ($NH_3$), and nitrogen ($N_2$) gases at a temperature of approximately 550° C. and a pressure ranging from approximately 5 Torr to approximately 10 Torr. The gas mixture is supplied using a radio frequency (RF) power of approximately 430 W. $SiH_4$ flows at a rate ranging from approximately 20 sccm to approximately 100 sccm. $NH_3$ flows at a rate ranging from approximately 10 sccm to approximately 50 sccm. $N_2$ flows at a rate ranging from approximately 4,000 sccm to approximately 5,000 sccm.

The silicon nitride layer is etched at a pressure ranging from approximately 30 mTorr to approximately 50 mTorr, a RF power ranging from approximately 500 W to approximately 2,000 W, a bias power ranging from approximately 100 W to approximately 1,000 W, and a temperature ranging from approximately 40° C. to approximately 60° C. in consideration of an etch rate of the silicon nitride layer. A gas mixture including fluoroform $CHF_3$, oxygen ($O_2$), and argon (Ar) is used as an etch gas. The $CHF_3$ flows at a rate ranging from approximately 30 sccm to approximately 50 sccm. The $O_2$ flows at a rate ranging from approximately 10 sccm to approximately 30 sccm. The Ar flows at a rate ranging from approximately 500 sccm to approximately 800 sccm.

The patterned second insulation layer and the patterned first insulation layer (not shown) exposed by the hard mask pattern 35 are etched to expose the drain region. Thus, a deep drain contact hole 37 is formed. However, a bowing event (refer to reference numeral 'A") occurs when forming the drain contact hole 37 because an etch target layer, that is, the second insulation layer and the patterned first insulation layer, has a large thickness. The bowing event includes bending of a portion of the second insulation layer. Thus, a critical dimension (CD) of the drain contact hole 37 in a portion where the bowing event occurs is shown as $CD_1$. Reference numeral 33 refers to a patterned second insulation layer.

The patterned second insulation layer 33 and the patterned first insulation layer are etched at a pressure ranging from approximately 30 mTorr to approximately 50 mTorr, a RF power ranging from approximately 1,000 W to approximately 2,000 W, a bias power ranging from approximately 1,500 W to approximately 2,000 W, and a temperature ranging from approximately 40° C. to approximately 60° C. in consideration of an etch rate of the HDP oxide-layer. A gas mixture including hexafluoro-1,3-butadiene ($C_4F_6$), oxygen ($O_2$), tetrafluorofomethane ($CF_4$), and argon (Ar) is used as an etch gas. The $C_4F_6$ flows at a rate ranging from approximately 30 sccm to approximately 50 sccm. The $O_2$ flows at a rate ranging from approximately 10 sccm to approximately 50 sccm. The $CF_4$ flows at a rate ranging from approximately 10 sccm to approximately 30 sccm. The Ar flows at a rate ranging from approximately 500 sccm to approximately 800 sccm.

A process for seasoning the chamber is additionally performed to stabilize the atmosphere in the chamber before the etch process for forming the drain contact hole 37. For instance, twenty wafers are dried at substantially the same time.

Referring to FIG. 3B, a polysilicon layer 39 for forming the drain contact plug is formed over the hard mask pattern 35 and fills in the drain contact hole 37 (FIG. 3A). However, the drain contact hole 37 may not be completely filled when the polysilicon layer 39 is formed. A seam in the shape of a keyhole (refer to 'B") may be generated. This result is obtained because the polysilicon layer 39 having a sufficient step coverage characteristic is formed along the surface profile of the drain contact hole 37. The seam is generated to have a certain depth ($D_2$) from an upper surface of the patterned second insulation layer 33. For instance, the depth '$D_2$' is approximately 1,000 Å or greater.

Figure 1C:
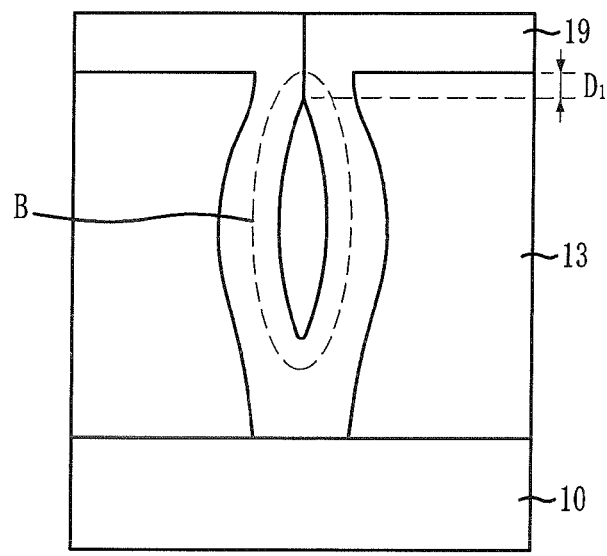
Figure 1D:
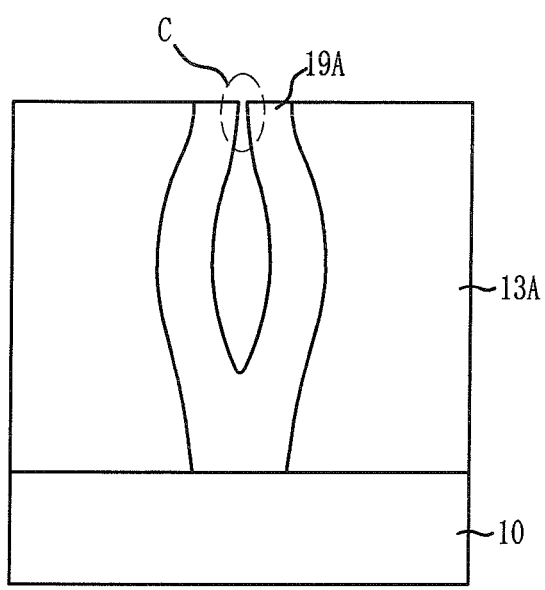
Figure 2:
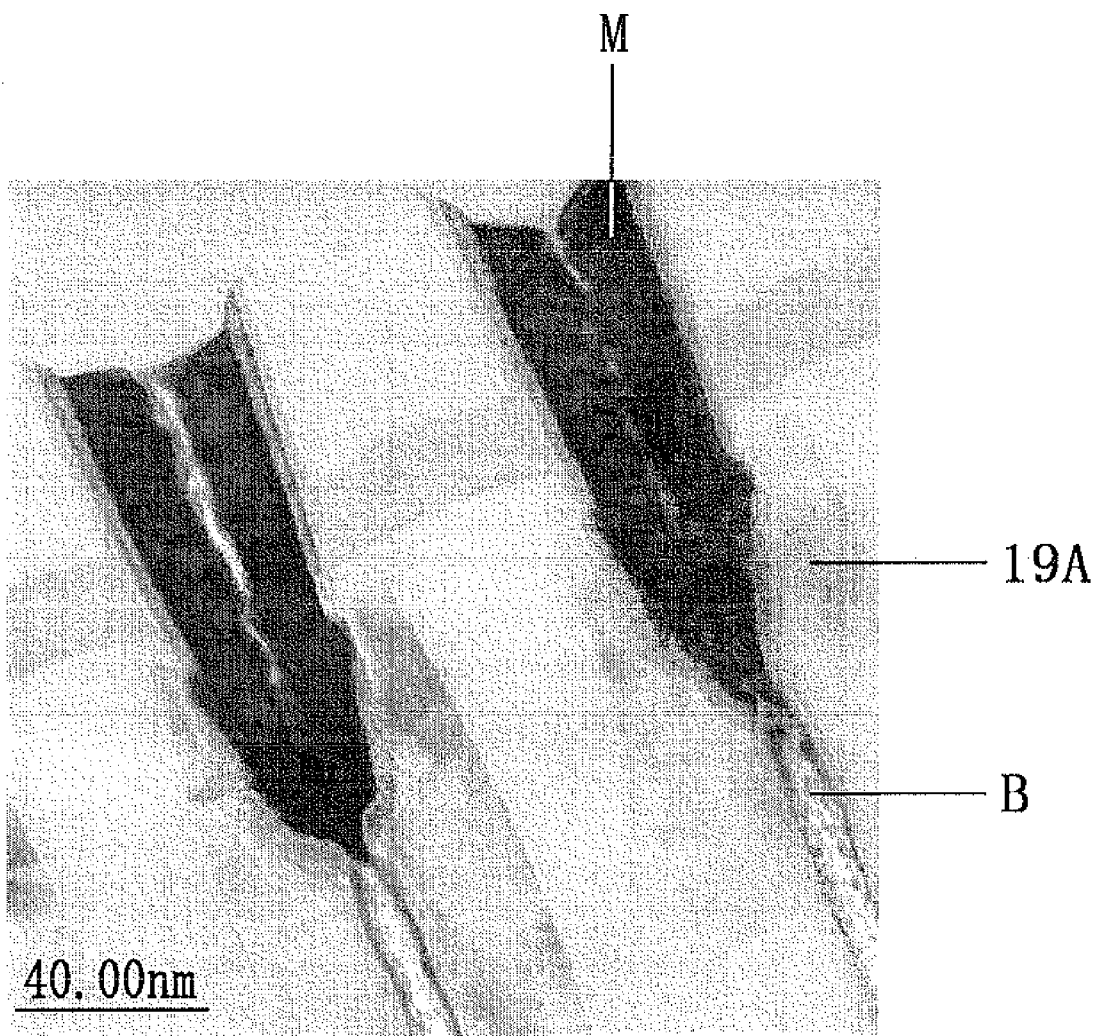
FIG. 2 illustrates a micrographic view showing a seam generated in a drain contact plug when forming the drain contact plug using a conventional method.

The seam according to an embodiment of the present invention is formed at a deeper region and has a smaller size than a seam generated by a conventional method as shown by reference denotation $D_1$ in FIG. 1C (i.e., $D_2$>$D_1$). This result is obtained because the CD of the drain contact hole 37 is maintained at '$CD_1$' as shown in FIG. 3A.

Referring to FIG. 3C, the polysilicon layer 39 and the hard mask pattern 35 are polished using a CMP process. Therefore, a drain contact plug 39A is formed. The CMP process is performed such that a top portion of the seam is not exposed (refer to reference denotation 'E'). Therefore, limitations caused by the exposure of the top portion of the seam may be overcome. For example, the likelihood of an erase failure may be reduced. As a result, device characteristics may be improved.

A low selectivity slurry is used during the CMP process so that the top portion of the seam is not exposed. The low selectivity slurry has a selectivity of the patterned second insulation layer 33 to the hard mask pattern 35 to the polysilicon layer 39 in a range of approximately 1:0.5 to 1:1 to 5.

For example, the slurry includes colloidal silica as an abrasive with a concentration ranging from approximately 1 wt % to approximately 10 wt %. The slurry also includes hydrogen peroxide as an oxidizing agent with a concentration ranging from approximately 1 wt % to approximately 5 wt %. The slurry includes a mixture including ammonia and ethylated amine as a complexing agent with a concentration ranging from approximately 0.1 wt % to approximately 1 wt %. The slurry includes a corrosion inhibitor with a concentration ranging from approximately 0.1 wt % to approximately 3 wt%.

The corrosion inhibitor may include fatty acid alkanolamide, phosphate ester, aminotrimethylene phosphonic acid, diethylene triamine pentamethylene phosphonic acid, ethoxylated amine, a mixture including undecanedioic acid (40%), dodecanedioic acid (36%), sebacic acid (10%), and amine (10%), oleyl hydroxyethl imidazoline, stearyl imidazoline, octylphenol ethoxylate, amine ethoxylate, achohol ethoxylate, ethylene oxide, propylene oxide, N-trimethoxysilylpropyl-polyethyleneimine, behenyl hydroxyethtyl imidazoline, cocoyl hydroxyethyyl imidazoline, isostearyl hydroxyethtyl imidazoline, lauryl hydroxyethtyl imidazoline, oleyl imidazoline, stearic imidazoline, or fatty acid imidazoline.

The CMP process is performed under the following conditions in consideration of a polishing rate and a polishing unevenness. For example, a pressurized chamber pressure, a retainer ring pressure, a main air bag condition pressure, a center air bag pressure each range from approximately 100 hPa to approximately 300 hPa. A top ring rate ranges from approximately 30 rpm to approximately 100 rpm, a turn table rate ranges from approximately 30 rpm to approximately 200 rpm, and a slurry flow rate ranges from approximately 100 ml/min to approximately 300 ml/min. A dresser down force ranges from approximately 50 newtons to approximately 100 newtons, a dresser time ranges from approximately 5 seconds to approximately 60 seconds, and a dresser velocity ranges from approximately 10 rpm to approximately 100 rpm.

Figure 4:
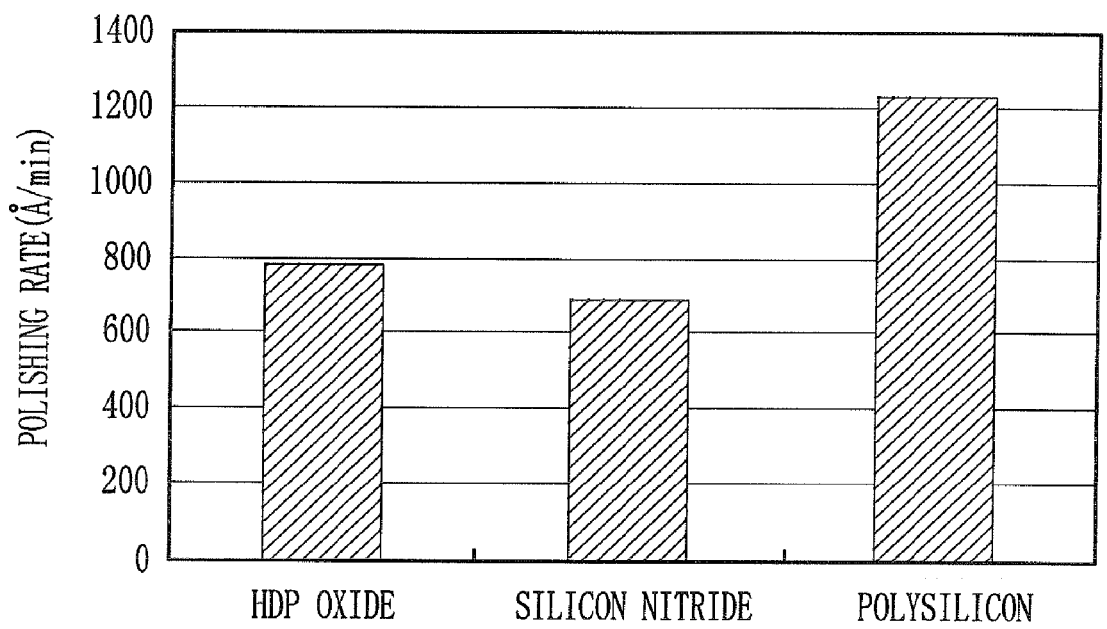
FIG. 4 illustrates a diagram showing polishing rates of a high density plasma (HDP) oxide layer, a silicon nitride layer, and a polysilicon layer during a chemical mechanical polishing (CMP) process under slurry and process conditions in accordance with an embodiment of the present invention.

FIG. 4 illustrates a diagram showing polishing rates of a HDP oxide layer, a silicon nitride layer, and a polysilicon layer during a CMP process under slurry and process conditions in accordance with an embodiment of the present invention. A polishing rate of the HDP oxide layer is approximately 800 Å/min. A polishing rate of the silicon nitride layer is approximately 700 Å/min. A polishing rate of the polysilicon layer is approximately 1,200 Å/min. As a result, when using a slurry fabricated according to this embodiment, a ratio of the polishing rates of the HDP oxide layer to the silicon nitride layer to the polysilicon layer is approximately 1:0.9:1.5. Thus, a desirable polishing selectivity in accordance with an embodiment of the invention may be obtained. Specifically, the polishing selectivity of the patterned second insulation layer 33 to the hard mask pattern 35 to the polysilicon layer 39 is approximately 1:0.5 to 1:1 to 5.

Accordingly, the patterned second insulation layer 33, the hard mask pattern 35, and the polysilicon layer 39 are polished simultaneously. Thus, the conventional etch process for removing the hard mask pattern 35 separately may be omitted. Therefore, limitations related to the conventional method where the increasing bowing event and the increasing CD of the drain contact hole due to the removal of hard mask pattern causes the seam to increase in a subsequent polysilicon layer, may be prevented. Also, the number of processes may be reduced, thereby decreasing production costs.

The polysilicon layer 39 is formed while not removing the hard mask pattern 35 after forming the drain contact hole 37. The hard mask pattern 35, the patterned second insulation layer 33, and the polysilicon layer 39 are polished at substantially the same time to form the drain contact plug 39A. Therefore, the exposure of the top portion of the seam (B') may be prevented. Accordingly, the likelihood of an erase failure of the NAND-type flash device may be reduced, thereby improving the yield of the device.

Figure 5:
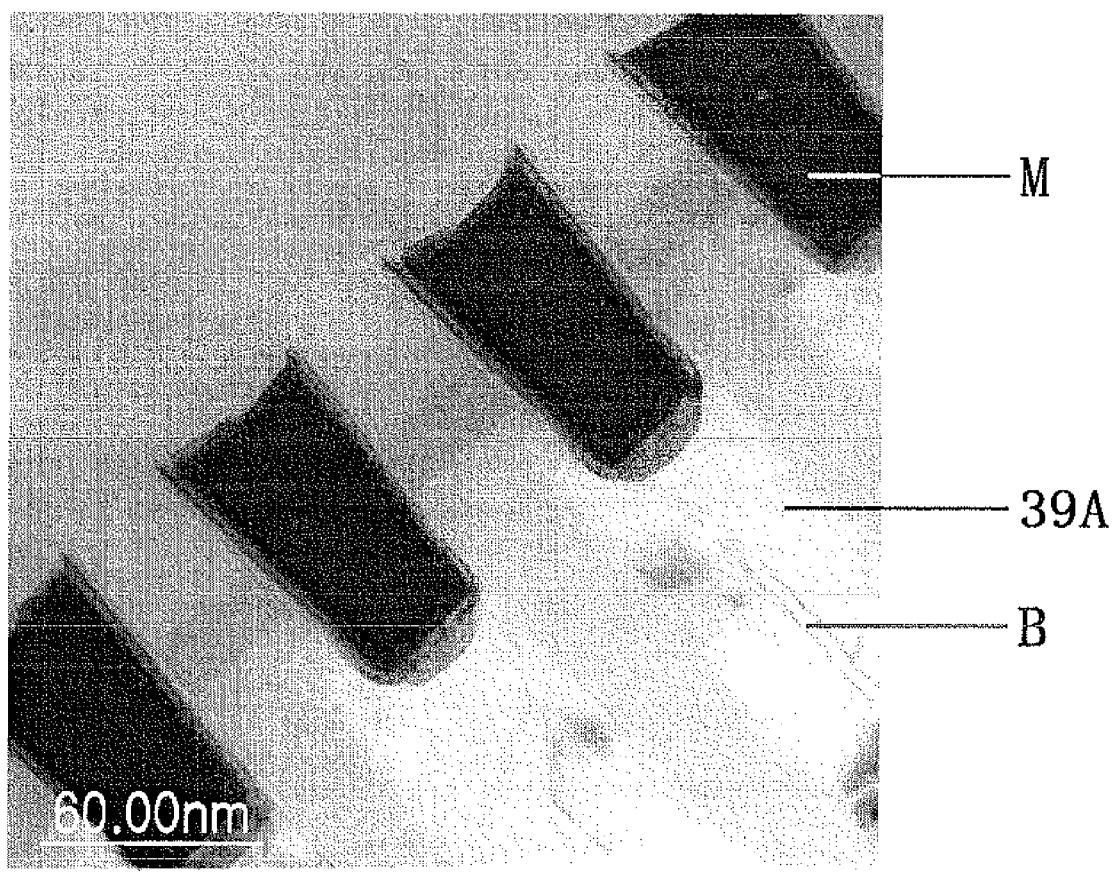
FIG. 5 illustrates a micrographic view of a drain contact plug formed in accordance with an embodiment of the present invention.

FIG. 5 illustrates a micrographic view of the drain contact plug formed in accordance with an embodiment of the present invention. The seam (B') having the shape of a keyhole is generated in the middle of the drain contact plug 39A and is not exposed. Therefore, subsequent metal lines M may be formed without any undesirable events.

As is apparent from the above description, a low polishing selectivity is used during the CMP process performed after forming the polysilicon layer for forming a drain contact plug. The low selectivity slurry has a selectivity of the patterned second insulation layer to the hard mask pattern to the polysilicon layer in a range of approximately 1:0.5 to 1:1 to 5. Accordingly, the patterned second insulation layer, the hard mask pattern, and the polysilicon layer are polished simultaneously. Thus, the conventional etch process for removing the hard mask pattern separately may be omitted. Therefore, limitations related to the conventional method where the increasing bowing event and the increasing CD of the drain contact hole due to the removal of hard mask pattern causes the seam to increase in a subsequent polysilicon layer, may be prevented. Also, the number of processes may be reduced, thereby decreasing production costs.

The polysilicon layer is formed while not removing the hard mask pattern 35 after forming the drain contact hole. The hard mask pattern, the patterned second insulation layer, and the polysilicon layer are polished at substantially the same time to form the drain contact plug. Therefore, the exposure of the top portion of the seam (B') may be prevented. Accordingly, the likelihood of an erase failure of the NAND-type flash device may be reduced, thereby improving the yield of the device.

While the present invention has been described with respect to specific embodiments, it will be apparent to those skilled in the art that various changes and modifications may be made without departing from the spirit and scope of the invention as defined in the following claims.

What is claimed is:

1. A method for forming a contact plug in a semiconductor device, the method comprising:
 providing a substrate having an insulation layer;
 forming a hard mask pattern over the insulation layer;
 etching the insulation layer using the hard mask pattern to form a contact hole;
 forming a plug material over the hard mask pattern to fill the contact hole; and
 polishing the insulation layer, the hard mask pattern, and the plug material at the same time by using a slurry having a polishing selectivity of the insulation layer to the hard mask pattern to the lug material in a range of 1:0.5 to 1:1 to 5 such that a seam generated in the contact hole while forming the plug material is not exposed, wherein the hard mask pattern is removed during the polishing process.

2. The method of claim 1, wherein the insulation layer comprises an oxide-based material.

3. The method of claim 2, wherein the hard mask pattern comprises a nitride-based material.

4. The method of claim 3, wherein the plug material comprises polysilicon.

5. The method of claim 4, wherein the slurry comprises using colloidal silica as an abrasive, hydrogen peroxide as an oxidizing agent, and a mixture of ammonia and ethylated as a complexing agent.

6. The method of claim 5, wherein the slurry further comprises a corrosion inhibitor comprising one selected from a group consisting of: fatty acid alkanolamide, phosphate ester, aminotrimethylene phosphonic acid, diethylene triamine pentamethylene phosphonic acid, ethoxylated amine, a mixture including undecanedioic acid (40%), dodecanedioic acid (36%), sebacic acid (10%), and amine (10%), oleyl hydroxyethl imidazoline, stearyl imidazoline, octylphenol ethoxylate, amine ethoxylate, achohol ethoxylate, ethylene oxide, propylene oxide, N-trimethoxysilylpropyl-polyethyleneimine, behenyl hydroxyethtyl imidazoline, cocoyl hydroxyethyyl imidazoline, isostearyl hydroxyethtyl imidazoline, lauryl hydroxyethtyl imidazoline, oleyl imidazoline, stearic imidazoline, and fatty acid imidazoline.

7. The method of claim 6, wherein the slurry comprises the colloidal silica with a concentration ranging from approximately 1 wt% to approximately 10 wt%, the hydrogen peroxide with a concentration ranging from approximately 1 wt% to approximately 5 wt%, the mixture including ammonia and ethylate amine with a concentration ranging from approximately 0.1 wt% to approximately 1 wt%, and the phosphate ester with a concentration ranging from approximately 0.1 wt% to approximately 3 wt%.

8. The method of claim 1, wherein the plug material is formed such that the seam is generated at a depth of approximately 1,000 Å or greater from a top surface of the insulation layer.

9. The method of claim 1, further comprising, before forming the contact hole, seasoning a chamber.

10. A method for forming a contact plug in a semiconductor device, the method comprising:
 forming a first insulation layer including a source contact plug over a substrate;
 forming a second insulation layer over the first insulation layer;
 forming a hard mask pattern over the second insulation layer;
 etching the first and second insulation layers using the hard mask pattern to form a drain contact hole, wherein the substrate is exposed in the drain contact hole;
 forming a plug material over the hard mask pattern to fill the drain contact hole; and
 polishing the second insulation layer, the hard mask pattern, and the plug material at the same time by using a slurry having a polishing selectivity of the second insulation layer to the hard mask pattern to the plug material in a range of approximately 1:0.5 to 1:1 to 5 such that a seam generated in the drain contact hole while forming the plug material is not exposed, wherein the hard mask pattern is removed during the polishing process.

11. The method of claim 10, wherein the first and the second insulation layers comprise an oxide-based material.

12. The method of claim 11, wherein the hard mask pattern comprises a nitride-based material.

13. The method of claim 12, wherein the plug material comprises polysilicon.

14. The method of claim 13, wherein the slurry comprises using colloidal silica as an abrasive, hydrogen peroxide as an oxidizing agent, and a mixture of ammonia and ethylated amine as a complexing agent.

15. The method of claim 14, wherein the slurry further comprises a corrosion inhibitor comprising one selected from a group consisting of: fatty acid alkanolamide, phosphate ester, aminotrimethylene phosphonic acid, diethylene triamine pentamethylene phosphonic acid, ethoxylated amine, a mixture including undecanedioic acid (40%), dodecanedioic acid (36%), sebacic acid (10%), and amine (10%), oleyl hydroxyethl imidazoline, stearyl imidazoline, octylphenol ethoxylate, amine ethoxylate, achohol ethoxylate, ethylene oxide, propylene oxide, N-trimethoxysilylpropyl-polyethyleneimine, behenyl hydroxyethtyl imidazoline, cocoyl hydroxyethyyl imidazoline, isostearyl hydroxyethtyl imidazoline, lauryl hydroxyethtyl imidazoline, oleyl imidazoline, stearic imidazoline, and fatty acid imidazoline.

16. The method of claim 15, wherein the slurry comprises the colloidal silica with a concentration ranging from approximately 1 wt% to approximately 10 wt%, the hydrogen peroxide with a concentration ranging from approximately 1 wt% to approximately 5 wt%, the mixture including ammonia and ethylated amine with a concentration ranging from approximately 0.1 wt% to approximately 1 wt%, and the phosphate ester with a concentration ranging from approximately 0.1 wt% to approximately 3 wt%.

17. The method of claim 10, wherein the plug material is formed such that the seam is generated at a depth of approximately 1,000 Å or greater from a top surface of the insulation layer.

18. The method of claim 10, further comprising, before forming the drain contact hole, seasoning a chamber.

* * * * *